United States Patent [19]
Kind et al.

[11] 3,942,103
[45] Mar. 2, 1976

[54] ARRANGEMENT FOR THE TESTING OF HIGH VOLTAGE DIRECT CURRENT SWITCHES

[75] Inventors: Dieter Kind, Braunschweig; Harald Brumshagen, Wolfenbuttel, both of Germany

[73] Assignee: Dieter Kind, Braunschweig, Germany

[22] Filed: July 19, 1974

[21] Appl. No.: 489,901

[30] Foreign Application Priority Data

July 19, 1973 Germany............................ 2336713

[52] U.S. Cl............................ 324/28 R; 324/28 CR
[51] Int. Cl.²............................................. G01R 31/02
[58] Field of Search......... 324/28 R, 28 CB, 28 CH, 324/28 CR, 28 RS, 28 SE; 317/123

[56] References Cited
UNITED STATES PATENTS

| 3,021,476 | 2/1962 | Khalifa | 324/28 R |
| 3,038,116 | 6/1962 | Einsele et al. | 324/28 R |

Primary Examiner—R. V. Rolinec
Assistant Examiner—Michael J. Tokar
Attorney, Agent, or Firm—Spencer & Kaye

[57] ABSTRACT

In a circuit for the simulated testing of a high voltage direct current switch, which arrangement includes a first direct voltage source producing a high current and low voltage output, a first auxiliary switch and a first inductance both connected in series with the source and arranged to be connected to the switch to be tested, an auxiliary voltage source having a low current and high voltage output and arranged to be connected to the switch for stressing it to its voltage breakdown level, the simulation produced by such circuit is improved by the provision of a second inductance connected to the auxiliary voltage source and arranged to be connected in series between the auxiliary source and the switch to be tested, and a second auxiliary switch connected in series with the auxiliary voltage source and arranged for operatively connecting the auxiliary source across the switch to be tested at a time after the opening of such switch and before the current through the switch, produced by the first voltage source, drops to zero.

6 Claims, 6 Drawing Figures

U.S. Patent   March 2, 1976   3,942,103
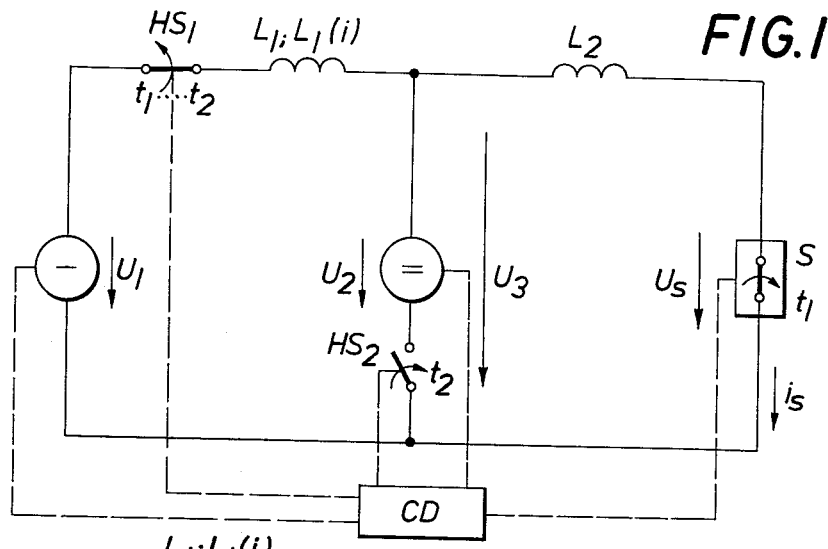
FIG.1
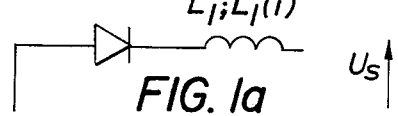
FIG. 1a
FIG. 1b
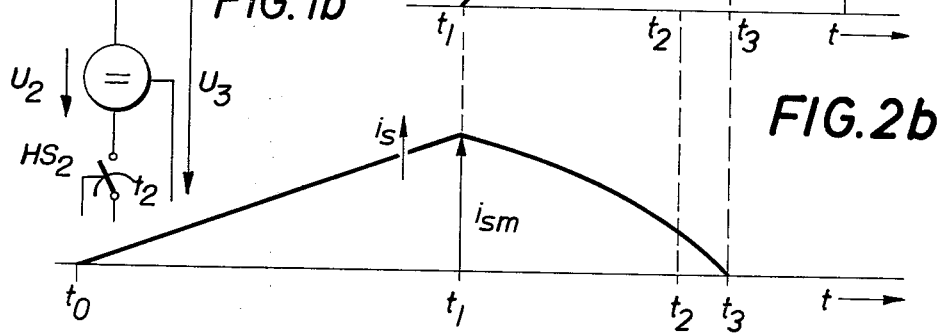
FIG.2a
FIG.2b
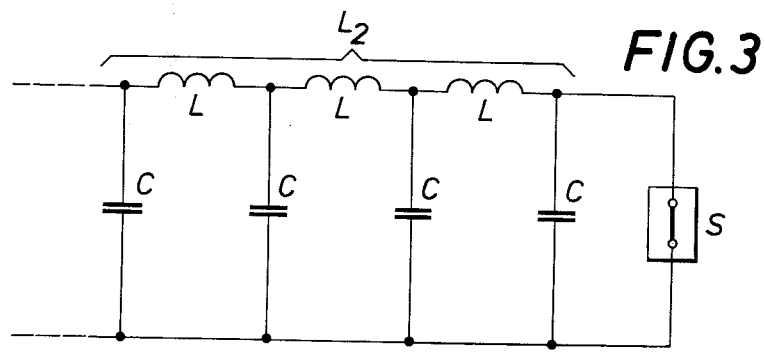
FIG.3

ARRANGEMENT FOR THE TESTING OF HIGH VOLTAGE DIRECT CURRENT SWITCHES

BACKGROUND OF THE INVENTION

The present invention relates to an arrangement for the synthetic testing of high voltage switches, the arrangement being of the type including a high current, low voltage direct voltage source, an auxiliary switch, an inductance and the switch to be tested, and an auxiliary voltage source having a low current and high voltage output which stresses the switch to be tested to its voltage breakdown level.

When a high voltage direct current in a high voltage direct current transmission network is interrupted by the opening of a switch, the switch must absorb the energy stored in the lines and in the smoothing chokes of the network and must work against the driving voltage of the network.

To simulate the stresses occurring in the test field under such conditions various synthetic test circuits are known.

Thus, the direct current required for testing can be obtained from an a.c. generator which operates at a reduced frequency, as disclosed in German Pat. No. 1,046,185. The current whose peak value is approximately constant is then considered to be a direct current. The recurring voltage at the switch to be tested is generated by an additional direct voltage source which is applied across the switch to be tested at the moment when the first-mentioned current becomes zero. A discharge of the direct voltage source into the high current circuit is prevented by an auxiliary switch in the high current circuit.

It is also known to simulate the switch stresses occurring during the switching-off process in test circuits with inductive storage, as disclosed in the German periodical (ETZ-A, Volume 93 (1972), Issue No. 3, page 164, FIG. 7a). In this circuit an inductance is charged by a direct voltage source of low voltage and the energy stored by the inductance is then converted in the switch to be tested. The high voltage occurring during the switching-off at the switch to be tested is produced predominantly by the inductance. The deviation in the stress placed on the switch to be tested with respect to the current waveform and the energy absorption during the switching-off process as a result of the reduced driving voltage when compared to real conditions can be compensated in part by a value of the inductance, which is greater than that present under real conditions.

The recurring voltage in the known process is simulated by an additional high-resistance auxiliary voltage source which is permanently connected to the switch and stresses the switch, after the switching-off process, to its voltage resistance, or breakdown value. An auxiliary switch can be used to isolate the high current circuit after the current has reached zero.

Due to the absence of the driving voltage, the simulation of the current waveform when it becomes zero and the waveform of the transient voltage at the switch only incompletely correspond in this method to the real conditions.

SUMMARY OF THE INVENTION

It is an object of the present invention to cause the stresses on the switch to be tested to better correspond to the real conditions existing in a high voltage direct current transmission network.

For this purpose the present invention provides a second inductance which is connected ahead of the switch to be tested and to enable the auxiliary voltage source to be switched in, at a certain time before the test current becomes zero, between the two inductances by means of a second auxiliary switch.

The auxiliary voltage source and the second inductance in this way form a simple equivalent circuit of a high voltage direct current network. This permits a much more precise simulation of the stresses on the switch than was possible with the known synthetic testing circuits.

BRIEF DESCRIPTION OF THE DRAWING

FIG. 1 is a circuit diagram of a preferred embodiment of a test arrangement according to the invention.

FIGS. 1a and 1b are detail views of modified portions of the embodiment shown in FIG. 1.

FIGS. 2a and 2b are graphs showing current and voltage waveforms during the operation of the arrangement of FIG. 1.

FIG. 3 is an embodiment of a simulated line inserted in the circuit diagram of FIG. 1.

DESCRIPTION OF THE PREFERRED EMBODIMENTS

FIG. 1 illustrates a preferred embodiment of a test circuit according to the invention, into which is connected a switch S which is to be tested.

The test circuit is composed of a source of direct voltage $u_1$ of a type producing a high current, low voltage output and an auxiliary source of direct voltage $u_2$ having a low current, high voltage output. Voltage $u_2$ is much greater than $u_1$ and $u_2$ constitutes a simulation of the recurring voltage to which switch S is subjected.

Connected between sources of voltage $u_1$ and $u_2$ are an auxiliary switch $HS_1$ and an inductance $L_1$, while a second inductance $L_2$ is connected between the source of voltage $u_2$ and the switch S to be tested. A second auxiliary switch $HS_2$ is connected in series with the source of voltage $u_2$.

Inductance $L_1$ is provided to enlarge the driving voltage $u_1$ of the test arrangement, which is low compared to the voltage on the high voltage direct current transmission network to be simulated, before the auxiliary source of direct voltage $u_2$ has been connected. Inductance $L_1$ can arrange to be switchable in dependence on the demanded test-current. This means, that only a part $L_1$ of a larger inductance is switched into the circuit in order to adjust the testing current to a desired value. The switchable inductance is also disclosed in the above cited German publication, FIG. 6a. Inductance $L_2$ is an element representing the lumped inductance of the high voltage direct current transmission network being simulated.

Switches $HS_1$ and $HS_2$ can be mechanical switches or electronic switching elements. Switch $HS_1$ can, for example, be constituted simply by a diode, as shown in FIG. 1a.

Before the test, a current flow is established through inductances $L_1$ and $L_2$ by the application of voltage $u_1$ at time $t_o$ via closed switches S and $HS_1$. Referring to FIGS. 2a and 2b, when the current, $i_s$, has reached a given value, $i_{sm}$, the test begins at time $t_1$ by opening of the contacts of switch S and reducing voltage $u_1$ to zero. A voltage $u_s$ caused by the loaded inductances $L_1$ and $L_2$, then builds up across switch S and current $i_s$ drops. At time $t_2$, shortly before the current $i_s$ becomes zero ($t_3$) the auxiliary source of voltage $u_2$ is switched in by closing switch $HS_2$. Switch S must now switch off against the voltage across the inductance $L_2$ and against the driving voltage $u_2$.

This corresponds very precisely to the conditions in the high voltage direct current transmission network.

The connection of the auxiliary source of voltage $u_2$ is advisably effected at that time $t_2$ when its voltage has become exactly equal to the raising voltage $u_3$ across the branch containing the auxiliary source. Otherwise a bend or discontinuity will occur in the waveform of current $i_s$.

Discharging of the auxiliary source of voltage $u_2$ through the source of voltage $u_1$ is prevented by auxiliary switch $HS_1$. $HS_1$ may consist of a mechanical switching contact with low energy absorption for example a vacuum interruptor which is opened during time interval $t_1 \ldots t_2$. Switch $HS_1$ may advisably also be designed as an electrical component, for example as a diode.

The auxiliary source of voltage $u_2$ may consist, for example, of a previously charged capacitor. The capacitance for an auxiliary voltage source including a capacitor must be of such value that the switch current $i_s$ occurring after time $t_2$ can flow until it becomes zero without the charging voltage for the test dropping to an undue level. It is further advisable for an additional resistor R or R($i$), respectively, to be included in the branch of the auxiliary source of voltage $u_2$, as shown in FIG. 1$b$, in order to simulate the resistances in the stations and lines of the high voltage direct current transmission network. This resistor can also be used to represent a commutation resistance, or energy absorber, connected in the circuit in the form of a commutation switch. The resistor R or, if current-depending, R($i$) however cannot be compared with the known resistance in the test circuit described in the publication cited in the BACKGROUND OF THE INVENTION, because its value is much lower.

In order to even more precisely simulate the transient voltage at switch S it is advisable to constitute the second inductance $L_2$ by a known simulated line of the type used in the testing of a.c. switches.

An example of an embodiment of a simulated line which can be used for the invention is shown in FIG. 3. The simulated line is inserted in the test circuit between the branch with voltage source $u_2$ and the switch S. The line, which replaces the inductance $L_2$, is built by three series-connected inductances L and four capacitors C, connecting the inductances with the ground line.

In order to coordinate the operation of the switches used in the described circuit, a control device CD is necessary. As shown in FIG. 1, the device is connected with the source of voltage $u_1$, the auxiliary switches $HS_1$ and $HS_2$, the switch S, and an instrument measuring the voltage $u_3$. When the test sequence is started, first the source of voltage $u_1$ will be switched on at time $t_0$. After a short time, at $t_1$ the control device causes $u_1$ and S be switched off. During the time interval $t_1 \ldots t_2$ the switch $HS_1$ is tripped and by opening it will maintain a low arc voltage until current zero. Tripping is not necessary if a diode is used for $HS_1$. At time $t_2$, when the measured voltage $u_3$ has risen up to the known value of voltage $u_2$, the auxiliary switch $HS_2$ is tripped to switch on. After the test the voltage $u_s$ remains on the value $u_2$ (FIG. 2$a$).

In order to further complete the disclosure of the invention, an exemplary set of numerical value for the voltages, currents, inductances, resistance and time periods of a test circuit according to FIG. 1 is given:

| | |
|---|---|
| voltage $u_1$ : | 10 kV |
| voltage $u_2$ : | 80 kV |
| current $i_{sm}$ : | 2 kA |
| inductance $L_1$ : | 500 mH |
| inductance $L_2$ : | 1000 mH |
| resistance R : | 20 Ω |
| time period $t_0$–$t_1$: | 300 ms |
| time period $t_1$–$t_2$: | 10 ms |
| time period $t_2$–$t_3$: | 2 ms |

It will be understood that the above description of the present invention is susceptible to various modifications, changes and adaptations, and the same are intended to be comprehended within the meaning and range of equivalents of the appended claims.

We claim:

1. In a circuit for the synthetic testing of a high voltage direct current switch, which arrangement includes a first direct voltage source having a high current and low voltage output, a first auxiliary switch and a first inductance both connected in series with the source, with the series arrangement of the source, first auxiliary switch and inductance being arranged for connection in series with the switch to be tested, an auxiliary voltage source having a low current and high voltage output arranged to be connected to the switch for stressing the switch to be tested to its voltage breakdown level, the improvement comprising: a second inductance connected to said auxiliary voltage source and arranged to be connected in series between said auxiliary source and the switch to be tested; a second auxiliary switch connected in series with said auxiliary voltage source and arranged for operatively connecting said auxiliary voltage source across the switch to be tested; and control means connected to said second auxiliary switch and arranged for connection to the switch to be tested for closing said second auxiliary switch in order to connect said auxiliary voltage source across the switch to be tested at a time after the opening of such switch and before the current through such switch, supplied by the first voltage source, drops to zero.

2. Arrangement as defined in claim 1 wherein said control means is arranged to close said second auxiliary switch for connecting said auxiliary voltage source at the moment when the voltage of said auxiliary source is equal to the variable voltage across the series arrangement of said auxiliary source and said second inductance.

3. Arrangement as defined in claim 1 wherein said first auxiliary switch is an electrical component.

4. Arrangement as defined in claim 3 wherein said first auxiliary switch is a diode.

5. Arrangement as defined in claim 1 further comprising an additional resistance connected in series with said auxiliary voltage source.

6. Arrangement as defined in claim 1 wherein said second inductance comprises a simulated line.

* * * * *